United States Patent [19]

Takekoshi et al.

[11] Patent Number: 5,479,233

[45] Date of Patent: Dec. 26, 1995

[54] PHOTOSENSITIVE LITHOGRAPHIC PRINTING PLATE PROCESSING APPARATUS

[75] Inventors: Tomoaki Takekoshi, Shizuoka; Sonosuke Miyazaki; Masao Nakamura, both of Tokyo, all of Japan

[73] Assignee: Fuji Photo Film Co., Ltd., Kanagawa, Japan

[21] Appl. No.: 309,625

[22] Filed: Sep. 21, 1994

Related U.S. Application Data

[63] Continuation-in-part of Ser. No. 83,464, Jun. 30, 1993, abandoned.

[30] Foreign Application Priority Data

Jul. 6, 1992 [JP] Japan ..................................... 4-178302

[51] Int. Cl.$^6$ ..................................................... G03D 3/02
[52] U.S. Cl. ............................ 354/324; 354/325; 354/298
[58] Field of Search ........................... 354/298, 316–318, 354/324, 325; 134/64 P, 64 R, 122 P, 122 R; 137/3

[56] References Cited

U.S. PATENT DOCUMENTS 4,284,343  8/1981  Junghanns ................................. 354/324
4,969,480  11/1990 Hughes ......................................... 137/3
5,223,881  6/1993  Nakagawa et al. ....................... 354/298

Primary Examiner—D. Rutledge
Attorney, Agent, or Firm—Sughrue, Mion, Zinn, Macpeak & Seas; Richard C. Turner; John J. Penny

[57] ABSTRACT

A photosensitive lithographic printing plate processing apparatus in which at least one of a gum solution and a plate baking conditioner stored in respective reservoirs is applied to a surface of a photosensitive lithographic printing plate that has been subject to developing processing.

A solution-replenishing device supplies at least one of the gum solution and the plate baking conditioner to the respective reservoirs. A water-supplying device supplies water to the reservoirs. A concentration-measuring device measures a concentration of at least one of the gum solution and the plate baking conditioner which are stored in the respective reservoirs. A concentration-regulating device regulates the concentration of at least one of the gum solution and the plate baking conditioner by operating at least one of the water-supplying device and the solution-replenishing device in at least one of a case in which a measured value of the concentration, which is measured by the concentration-measuring device, differs from a predetermined value and a case in which the measured value of the concentration lies outside a predetermined range.

4 Claims, 7 Drawing Sheets

PHOTOSENSITIVE LITHOGRAPHIC PRINTING PLATE PROCESSING APPARATUS

This is a Continuation-in-part of application No. 08/083,464 filed Jun. 30, 1993, now abandoned.

BACKGROUND OF THE INVENTION

1. Field of the Invention

The present invention relates to a photosensitive lithographic printing plate processing apparatus which is capable of replenishing processing solutions such as a gum solution for protecting a surface of a photosensitive lithographic printing plate, which has been processed for development, or a plate baking conditioner which is applied to the surface prior to baking treatment.

2. Description of the Related Art

A photosensitive lithographic printing plate, which has images printed thereon by a printing apparatus, is sent into a photosensitive lithographic printing plate processing apparatus in which the photosensitive lithographic printing plate is advanced in order through: a developing tank, where the photosensitive lithographic printing plate is subject to developing processing; a rinsing or washing tank, where the photosensitive lithographic printing plate is washed; and a desensitizing or finisher tank, where a gum solution (or a finisher solution) is applied to the photosensitive lithographic printing plate. Such application of the gum solution protects a surface of the photosensitive lithographic printing plate which has passed through developing and washing processes. The photosensitive lithographic printing plate is ejected from the photosensitive lithographic printing plate processor after a final stage, i.e., a drying process, is completed.

While being conveyed through the above developing tank, the photosensitive lithographic printing plate is immersed in a developing solution within the tank, or the developing solution is sprayed onto the surface of the photosensitive lithographic printing plate. The photosensitive lithographic printing plate is thereby subject to developing processing. Since the developing solution becomes progressively fatigued as the developing processing proceeds, the developing solution is replenished from a replenishing device in accordance with a degree of fatigue of the developing solution. The fatigue of the developing solution is defined as the activity of the same, and is estimated from measurements of the electric conductivity or pH of the developing solution or from developing-processing time and amount. On the basis of the results therefrom, the developing solution is replenished so that the activity thereof increases.

In addition, the surface of the photosensitive lithographic printing plate, which has been subject to developing processing, is protected by the gum solution (or the finisher solution) being applied thereto. However, since the gum solution is evaporated by heat that results from ambient temperatures or the drying process, changes in the concentration of the gum solution occur easily. In particular, since such a gum or finisher process is followed by the drying process, the gum or finisher solution is subject to heat, which results in evaporation. To overcome this drawback, a method has been used in which an evaporation amount of the gum solution is estimated (from experimental results, for example) in accordance with the environment in which the photosensitive lithographic printing plate is used (i.e., ambient temperature or humidity, drying air, and the like). The gum solution is replenished with a corresponding amount of water at definite time intervals or in accordance with the amount of the plate to be processed, thereby permitting concentration of the gum solution to be maintained within predetermined ranges. In order to accomplish the original function of the gum solution, a predetermined amount of gum solution of a predetermined concentration must be applied to the plate. However, the properties of the concentration of the gum solution and those of the activity of the developing solution are different. For example, the conductivity or pH of the gum or finisher solution greatly varies because components of the developing solution, which is located upstream of the gum or finisher solution, may become mixed in with the gum or finisher solution. However, such variations do not affect the function of the gum or finisher solution. The gum solution is replaced when a certain time or amount of processing is made to the photosensitive lithographic printing plate or when the gum solution becomes extensively contaminated.

In this way, the photosensitive lithographic printing plate processor is arranged to maintain a constant concentration of the gum solution in order to apply a certain amount of the gum solution to the surface of the photosensitive lithographic printing plate, thereby protecting the plate.

Further, in order to improve the printing durability of the printing plate, the surface of the printing plate is sometimes supplied with a plate baking conditioner before application of the gum solution thereto so that the surface is affinitizing. Thereafter, baking processing is effected. However, the affinitizing solution is also subject to evaporation under the influence of heat which radiates from a baking station at the subsequent process. In addition, the concentration of the gum solution or the affinitizing solution is sometimes regulated so as to be decreased for some reason.

A drawback of the above is that it is troublesome to set an amount of replenishment water for each change in application environments of the photosensitive lithographic printing plate processor. In particular, if the amount of replenishment water, which is based on processing time, does not match any application environment of the photosensitive lithographic printing plate processor, the concentration of the gum solution or the affinitizing solution consequently falls outside of a predetermined range. This makes it impossible to apply a certain amount of the gum solution or the affinitizing solution to the surface of the photosensitive lithographic printing plate. In addition, the thickness of a protective layer of the gum solution or the affinitizing solution adhering to the surface of the photosensitive lithographic printing plate is reduced. As a result, the plate surface cannot be provided with protection of uniform quality. As can be seen from the above, the replenishment amount is difficult to regulate precisely in accordance with various application environments or inherent misoperations of the photosensitive lithographic printing plate processor. This results in complicating the operation of the photosensitive lithographic printing plate processor.

SUMMARY OF THE INVENTION

In view of the above, an object of the present invention is to provide a photosensitive lithographic printing plate processor which is capable of maintaining a constant concentration of at least one of a gum solution and a plate baking conditioner which is supplied to a surface of a photosensitive lithographic printing plate, regardless of changes in application environments thereof, thereby protecting the surface of the photosensitive lithographic printing plate with uniform quality or improving printing durability.

A first aspect of the present invention provides a photosensitive lithographic printing plate processing apparatus in which at least one of a gum solution and a plate baking conditioner stored in respective reservoirs is applied to a surface of a photosensitive lithographic printing plate that has been subject to developing processing, the photosensitive lithographic printing plate-processing apparatus comprising: a solution-replenishing means for supplying at least one of the gum solution and the plate baking conditioner to the respective reservoirs; a water-supplying means for supplying water to the reservoirs; a concentration-measuring means for measuring a concentration of at least one of the gum solution and the plate baking conditioner which are stored in the respective reservoirs; and, a concentration-regulating means for regulating the concentration of at least one of the gum solution and the plate baking conditioner by operating at least one of the water-supplying means and the solution-replenishing means in at least one of a case in which a measured value of the concentration, which is measured by the concentration-measuring means, differs from a predetermined value and a case in which the measured value of the concentration lies outside a predetermined range.

A second aspect of the present invention provides a photosensitive lithographic printing plate processing apparatus in which at least one of a gum solution and a plate baking conditioner stored in respective reservoirs is applied to a surface of a photosensitive lithographic printing plate that has been subject to developing processing, the photosensitive lithographic printing plate processing apparatus comprising: a solution-replenishing means for supplying at least one of the gum solution and the plate baking conditioner to the respective reservoirs; a water-supplying means for supplying water to the reservoirs; a concentration-measuring means for measuring a concentration of at least one of the gum solution and the plate baking conditioner which are stored in the respective reservoirs; a concentration-regulating means for regulating the concentration of at least one of the gum solution and the plate baking conditioner by operating at least one of the water-supplying means and the solution-replenishing means in at least one of a case in which a measured value of the concentration, which is measured by the concentration-measuring means, differs from a predetermined value and a case in which the measured value of the concentration lies outside a predetermined range; and, a liquid surface level-detecting means for detecting a liquid surface level of at least one of the gum solution and the plate baking conditioner which are stored in the respective reservoirs, the concentration-regulating means operating at least one of the solution-replenishing means and the water-supplying means when the liquid surface level-detecting means detects that the liquid surface level is less than the predetermined range.

Further, a third aspect of the present invention provides a method for replenishing solutions in a photosensitive lithographic printing plate processing apparatus in which at least one of a gum solution and a plate baking conditioner stored in respective reservoirs is applied to a surface of a photosensitive lithographic printing plate that has been subject to developing processing, the method comprising the steps of: a concentration-measuring process of measuring a concentration of at least one of the gum solution and the plate baking conditioner which are stored in the respective reservoirs; a concentration-determining process of determining that a measured value of the concentration is one of within a predetermined range and outside of the predetermined range, and, when it is determined that the measured value of the concentration is outside of the predetermined range, determining that the measured value of the concentration is one of greater than and less than the predetermined range; a water-supplying process of supplying water to the reservoir when it is determined by the concentration-determining process that the measured value of the concentration is greater than the predetermined range; and, a solution-replenishing process of supplying at least one of the gum solution and the plate baking conditioner to the respective reservoirs when it is determined by the concentration-determining process that the measured value of the concentration is less than the predetermined range.

According to the first aspect of the present invention, the concentration of at least one of the gum solution and the plate baking conditioner, which are applied to the surface of the photosensitive lithographic printing plate that has been subject to developing processing, is measured. Then, water is replenished when the concentration is found to be greater than a predetermined value. More specifically, at least one of the gum solution and the plate baking conditioner is replenished with water when its concentration is measured and found to be higher due to evaporation and the like. As a result, the concentration of at least one of the gum solution and the plate baking conditioner can always be maintained in a definite range without troublesome operations which require estimating and establishing a loss of water in at least one of the gum solution and the plate baking conditioner in accordance with the application environment of the photosensitive lithographic printing plate. In addition, the concentration of at least one of the gum solution and the plate baking conditioner is automatically regulated by the addition of at least one of the gum replenishment solution and the plate baking conditioner when the gum solution or the plate baking conditioner is measured and found to be smaller than the predetermined range.

Further, in normal replenishment, processing solutions which include the gum solution and the plate baking conditioner, may be replenished with water and processing solutions for replenishment, on the basis of, for example, the amount of the photosensitive lithographic printing plate to be processed.

For example, when the gum solution concentration decreases below a predetermined range, the proportion of the gum stock solution and water may be changed, and the gum stock solution and water may be replenished so as to increase the concentration. This method permits the gum solution concentration to remain in a predetermined range, which allows the changing cycle of the gum solution to be extended and the running cost to be limited. In addition, the photosensitive lithographic printing plate processor can provide much improved maintainability.

According to the second aspect of the present invention, a level of at least one of the gum solution and the plate baking conditioner which are stored in the respective reservoirs is detected. When the level is found to be smaller than a predetermined range, the reservoir is supplied with at least one of replenishment water and the gum replenishment solution or the plate baking conditioner.

While the concentration is being measured, the replenishment water and at least one of the gum replenishment solution and the plate baking conditioner are added in a fixed ratio in accordance with a decrease in at least one of the gum solution and the plate baking conditioner. This method can eliminate replenishment that is based on the amount of the photosensitive lithographic printing plate to be processed. In addition, while the concentration of at least one of the gum solution and the plate baking conditioner stored in the respective reservoirs is being measured, the solution-replenishing means and the water-supplying means can be operated accurately for at least one of the gum solution and the plate baking conditioner. Therefore, the uniform quality of the photosensitive lithographic printing plate can be maintained.

The gum solution is an aqueous solution of gum arabic, which serves to increase the hydrophilicity and protection of non-image areas of the photosensitive lithographic printing plate. The plate baking conditioner is a fluid which is applied to the surface of the photosensitive lithographic printing plate prior to burning treatment. The burning treatment hardens the photosensitive layer of the photosensitive lithographic printing plate by heating of the photosensitive lithographic printing plate that has been subject to developing processing.

According to the third aspect of the present invention, the method for replenishing processing solutions comprises the concentration-measuring process. The concentration of at least one of the gum solution and the plate baking conditioner, which are stored in the respective reservoirs, is measured by the process. Based on the measured value of the concentration, either water or at least one of the gum solution and the plate baking conditioner is added to the reservoir. This method permits the concentration of at least one of the gum solution and the plate baking conditioner to be constantly maintained in a definite range without troublesome operations which are required in the prior art. That is, in the past, a loss of water in at least one of the gum solution and the plate baking conditioner must be estimated and established in accordance with the application environment of the photosensitive lithographic printing plate.

As previously described, the photosensitive lithographic printing plate processor according to the present invention is adapted to measure the concentration of at least one of the gum solution and the plate baking conditioner which are stored in the respective reservoirs and to operate the solution-replenishing means or the water-supplying means when the determined concentration is found to be greater than a predetermined range, thereby replenishing at least one of the gum solution and the plate baking conditioner stored in the respective reservoirs. This arrangement eliminates the need to setting the replenishment time and quantity of at least one of the gum solution and the plate baking conditioner whenever the operating environment or conditions are changed. Further, the specific gravity of at least one of the gum solution and the plate baking conditioner can be maintained in an optimum state, which protects the surface of the photosensitive lithographic printing plate with uniform quality or improves the printing durability.

In addition, because the specific gravity of at least one of the gum solution and the plate baking conditioner stored in the respective reservoirs are maintained in an optimal state, therefore, an excellent effect is provided in that a changing cycle of at least one of the gum solution and the plate baking conditioner can be extended, maintainability of the processor is greatly improved.

A fourth aspect of the present invention is a photosensitive lithographic printing plate processing apparatus in which one of a gum solution and a plate baking conditioner stored in a reservoir is applied to a surface of a photosensitive lithographic printing plate that has been subject to developing processing, the photosensitive lithographic printing plate processing apparatus comprising: a solution-replenishing means for supplying one of the gum solution and the plate baking conditioner to the reservoir; a water-supplying means for supplying water to the reservoir; a concentration-measuring means for measuring a concentration of one of the gum solution and the plate baking conditioner which is stored in the reservoir; a liquid surface level-detecting means for detecting a liquid surface level of one of the gum solution and the plate baking conditioner which is stored in the reservoir; determining means for determining that the measured value of the concentration and the liquid surface level, respectively, are one of in a predetermined range, greater than the predetermined range, and less than the predetermined range; and control means for controlling the solution-replenishing means and the water-supplying means and for replenishing water and/or one of the gum solution and the plate baking conditioner, in accordance with a combination of determinations regarding the measured value of the concentration and the liquid surface level.

A fifth aspect of the present invention is a method for replenishing solutions in a photosensitive lithographic printing plate processing apparatus in which one of a gum solution and a plate baking conditioner stored in a reservoir is applied to a surface of a photosensitive lithographic printing plate that has been subject to developing processing, the method comprising the steps of: measuring a concentration of one of the gum solution and the plate baking conditioner which is stored in the reservoir; determining that a measured value of the concentration is within a predetermined range or outside of the predetermined range, and, when it is determined that the measured value of the concentration is outside of the predetermined range, determining that the measured value of the concentration is greater than or less than the predetermined range; and replenishing water and/or one of the gum solution and the plate baking conditioner, in accordance with a combination of determinations regarding the measured value of the concentration and a liquid surface level, the steps being implemented at predetermined, uniform time intervals.

DESCRIPTION OF THE PREFERRED EMBODIMENTS

Figure 1:
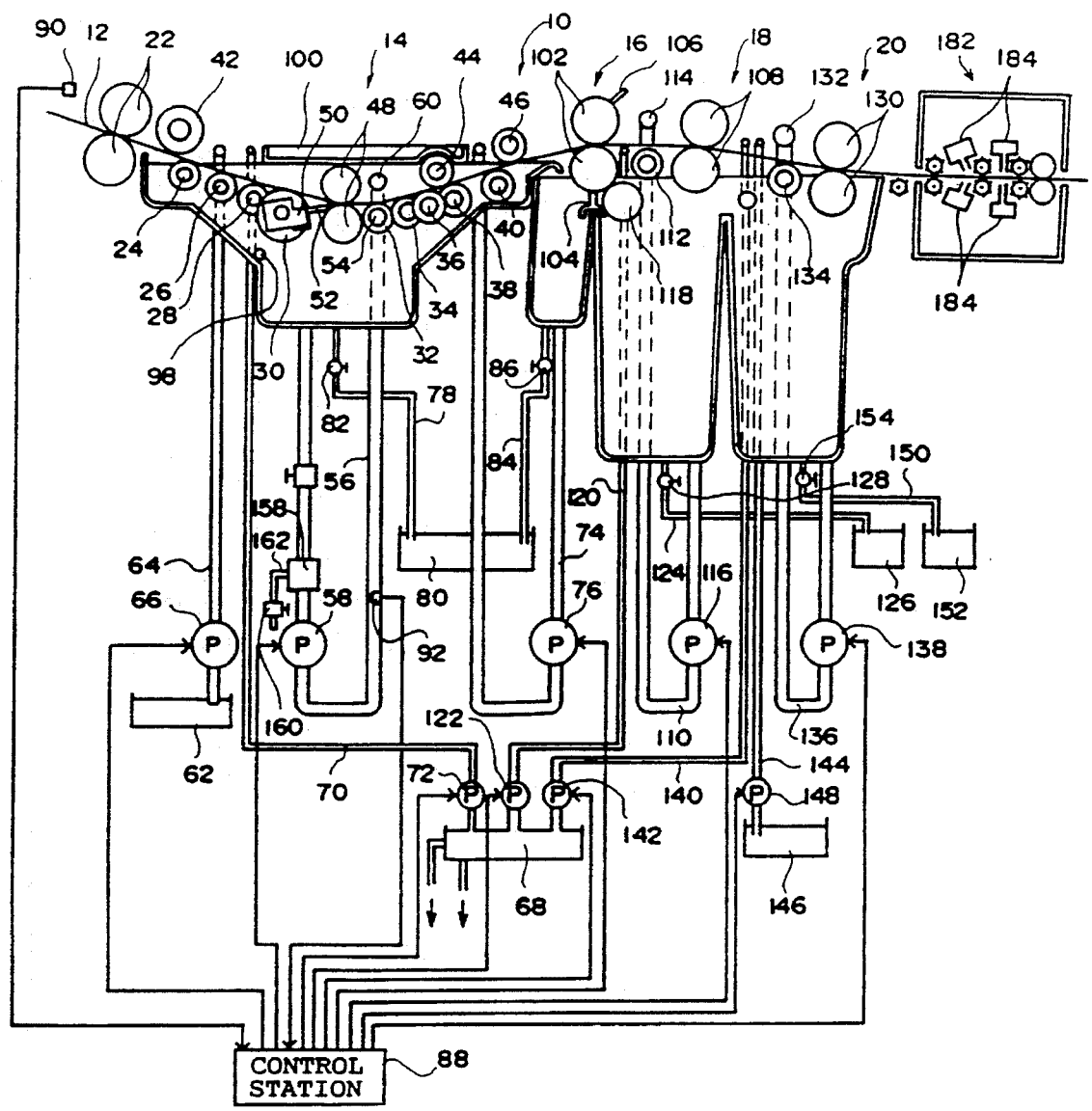
FIG. 1 is a schematic structural view, showing a photosensitive lithographic printing plate processing apparatus which is used in the present invention.

FIG. 1 depicts a photosensitive lithographic printing plate (hereinafter referred to as a PS plate) processor 10. The PS plate processor 10 includes: a developing tank 14 for developing processing of a PS plate 12 on which images are printed by an unillustrated printing apparatus; an overflow tank 16 for collecting excessive developing solution which overflows from the developing tank 14; a rinsing tank 18 for rinsing the surface of the PS plate 12; and, a finisher tank 20 for applying a gum solution to the surface of the PS plate 12 in order to protect the plate surface.

In the PS plate processor 10, a pair of conveying rollers 22 is positioned on an entry side of the developing tank 14 where the PS plate 12 is inserted into the tank 14. The PS plate 12, which has images printed thereon by the unillustrated printing apparatus, is inserted between the pair of conveying rollers 22.

The developing tank 14 has a substantially rectangular shape; a top portion of the tank 14 is open, and a lower-central portion of the tank 14 projects in a downward direction of the tank 14. The developing tank 14 contains a developing solution. In the developing tank 14, a series of guide rollers 24, 26, 28, 34, 36, 38, and 40 are positioned so as to correspond to the shape of the lower-central portion of the developing tank 14. The above-described guide rollers are skewer-type rollers in which a plurality of resilient, rotating members are rotatably supported by each shaft in an axial direction thereof. The shaft extends between and is supported by an unillustrated pair of side plates.

A guide roller 42 is disposed above the guide roller 24. The guide roller 42 has a larger diameter than the guide roller 24. In addition, guide rollers 44 and 46 are positioned above the guide rollers 38 and 40, respectively. Similarly to the previously-mentioned guide rollers 24, 26, 28, 34, 36, 38, and 40, the guide rollers 42, 44, and 46 are skewer-type rollers which are mounted between and supported by the unillustrated pair of side plates.

In the developing tank 14, a pair of conveying rollers 48 is positioned between the guide rollers 28 and 34 at a central portion of the tank 14. Similarly to the guide rollers 24, 26, 28, 34, 36, 38, 40, 42, 44, and 46, the pair of conveying rollers 48 is suspended between the pair of side plates so as to be rotatably supported thereby. The conveying rollers 48 are rotated by driving force which is transmitted from an unillustrated driving means.

A guide roller 32 is interposed between the pair of conveying rollers 48 and the guide roller 34. The guide roller 32 is a skewer-type roller in which a plurality of resilient, rotating members are rotatably supported on the periphery of a roller shaft of the guide roller 32. The roller shaft is made of a hollow pipe, and forms a spray pipe 54 which has discharge ports opened between the resilient, rotating members in an axial direction of the spray pipe 54. That is, the guide roller 32 is a skewer-type roller which serves as a spray pipe as well.

A guide roller 30 is positioned between the guide roller 28 and the pair of conveying rollers 48. The guide roller 30 has a larger diameter than the respective diameters of the guide rollers 24, 26, 28, 32, 34, 36, 38, and 40. The guide roller 30 is also a skewer-type roller, and spans between the pair of side plates so as to be supported thereby in a manner similar to the above-noted guide rollers 24, 26, 28, 32, 34, 36, 38, 40.42, 44, and 46. A guide 52 is mounted to a shaft of the guide roller 30 via a bracket 50. Since the guide 52 is positioned such that one end thereof is directed toward the pair of conveying rollers 48, a leading edge of the PS plate 12 is guided between the conveying rollers 48.

In the above arrangement, the PS plate 12 passes between the guide rollers 24 and 42 immediately after being inserted into the developing tank 14 by the pair of conveying rollers 22 that conveys and holds the PS plate 12 therebetween. The PS plate 12 is moved in the developing tank 14 at a downward slant while being guided by the guide rollers 26, 28, and 30 and by the guide 52 successively. Thereafter, the PS plate 12 is inserted between the pair of conveying rollers 48. After passing therebetween, the PS plate 12 is further conveyed through the developing tank 14 at an upward slant while being successively guided by the guide rollers 32, 34, 36, 38, and 40. Then, the PS plate 12 is delivered out of the developing tank 14 while being guided by the guide roller 46. The PS plate 12 is thereby delivered to a region above the overflow tank 16. While being conveyed by the above-described plurality of conveying rollers and guided by the above-mentioned plurality of guide rollers, the PS plate 12 is immersed in the developing solution within the developing tank 14, and is thereby subject to developing processing.

A downstream side wall of the developing tank 14 in the conveying direction of the PS plate 12 is defined with a curved portion which is bent in an outward direction of the developing tank 14. The curved portion has a smaller height in a vertical direction thereof than an upstream side wall of the developing tank 14 in the conveying direction of the PS plate 12. When excess developing solution overflows from the developing tank 14 that is overfilled with the developing solution, the excess solution reliably flows over the curved portion into the overflow tank 16. The overflowing developing solution is thereby collected in the overflow tank 16.

The spray pipe 54 communicates with the vicinity of one end of a conduit 56. The other end of the conduit 56 communicates with the bottom of the developing tank 14, and a circulating pump 58 is provided midway along the conduit 56. The developing solution under a given pressure is pumped through the spray pipe 54 by actuation of the circulating pump 58. A spray pipe 60 is positioned above the guide roller 32. The spray pipe 60 has a plurality of outlets opened in an axial direction thereof. Since the spray pipe 60 communicates with the conduit 56, the developing solution within the developing tank 14 is pumped through the spray pipe 60 by actuation of the circulating pump 58.

Further, a housing 158 is provided at an intermediate portion of the conduit 56 in a longitudinal direction thereof at a position further upstream than the circulating pump 58. The housing 158 accommodates a filter.

The conduit 56, which communicates with the housing 158, has a conduit 162 diverging therefrom at the housing 158. The conduit 162 is provided with a valve 160. When the valve 160 is opened, the developing solution is drained from the conduit 56, the housing 158, and the conduit 162. In order to prevent back flow of the developing solution, contaminants, which adhere to a filter wall after being removed from the solution by the filter, are discharged together with the draining developing solution.

In addition, one end of a conduit 64 is open above the developing tank 14. The conduit 64 communicates with a developing solution-replenishing tank 62. A developing solution replenishing pump 66 is provided at an intermediate portion of the conduit 64 along a length thereof. Further, one end of a conduit 70 is open above the developing tank 14. The conduit 70 communicates with a water tank 68. A water feeding pump 72 is disposed at an intermediate portion of the conduit 70 in the longitudinal direction thereof. Accordingly, an undiluted developing replenishment solution and water are pumped into the developing tank 14 in a predetermined ratio from the developing solution-replenishing tank 62 and the water tank 68, respectively, by means of the developing solution replenishing pump 66 and the water feeding pump 72.

Moreover, one end of another conduit 74 is open above the developing tank 14. The other end of the conduit 74 communicates with the bottom of the overflow tank 16. A return pump 76 is disposed at an intermediate portion of the conduit 74 in the longitudinal direction thereof. The developing solution that overflows into the overflow tank 16 and collects therein is thereby returned to the developing tank 14 through the return pump 76.

One end of a drainage pipe 78 communicates with the bottom of the developing tank 14, and the other end opens into a waste liquid reservoir 80. A valve 82 is disposed at an intermediate portion of the drainage pipe 78 in the longitudinal direction thereof. When the valve 82 is opened, the developing solution within the developing tank 14 is drained into the waste liquid reservoir 80. In addition, one end of a drainage pipe 84 opens at the bottom of the overflow tank 16, and the other end opens at the waste liquid reservoir 80. A valve 86 is disposed at an intermediate portion of the drainage pipe 84 in the longitudinal direction thereof. When the valve 86 is opened, the developing solution within the overflow tank 16 is discharged into the waste liquid reservoir 80.

The circulating pump 58, the developing solution replenishing pump 66, the water feeding pump 72, and the return pump 76 are connected to a control station 88 which is provided within the PS plate processor 10 in order to control actuation of these pumps.

A detector 90 is disposed on the upstream side of the pair of the conveying rollers 22 in the conveying direction of the PS plate 12. The detector 90 is linked to the control station 88 as well. The detector 90 detects the time in which the PS plate 12 passes through an input port of the PS plate processor 10. The detected time is added to data containing a preset PS plate processing speed and the width of the PS plate 12. The area of the PS plate 12 which is inserted into the PS plate processor 10 is thereby calculated at the control station 88.

Further, a developing solution activity detector 92 is provided along the conduit 56. The activity detector 92 determines the activity of the developing solution by detecting the impedance of the same solution. The activity detector 92 is connected to the control station 88.

In addition, a heater 98 is disposed adjacent to the bottom of the developing tank 14 in order to heat and maintain the developing solution within the developing tank 14 at a predetermined temperature. Since the heater 98 extends along the entire width of the PS plate 12, the developing solution within the tank 14 is heated uniformly at least in a transverse direction of the PS plate 12. Since the developing solution is heated in this manner, uniform developing processing can be effected when the PS plate 12 is conveyed through the developing tank 14.

A floating cover 100 covers the surface of the developing solution within the developing tank 14. The floating cover 100 prevents the deterioration of the developing solution which would otherwise absorb carbon dioxide in the air, thereby causing the carbon dioxide to be neutralized with alkaline components in the developing solution.

A pair of conveying rollers 102 is positioned on top of a side plate adjacent to the overflow tank 16 and the rinsing tank 18. The conveying rollers 102 are aligned in a vertical direction of the side plate. The pair of conveying rollers 102 is suspended between and supported by an unillustrated pair of side plates, and is rotated by driving force that is transmitted from an unillustrated driving means. A blade 104 is located within the overflow tank 16 so as to abut a lower roller of the pair of conveying rollers 102. Although some developing solution is taken out of the developing tank 14 by the PS plate 12 and is transferred to the pair of conveying rollers 102, the blade 104 scrapes the transferred solution therefrom. The same developing solution is thereby recovered in the overflow tank 16.

Moreover, a blade 106 is positioned on a side of the rinsing tank 18 so as to abut the periphery of an upper roller of the conveying rollers 102. Rinsing solution adhering to the conveying rollers 102 is thereby removed therefrom, and is returned to the rinsing tank 18.

A pair of conveying rollers 108 is located above the rinsing tank 18 on a downstream side of the tank 18 in the conveying direction of the PS plate 12. The conveying rollers 108 are aligned in a vertical direction of the rinsing tank 18. Similarly to the pair of conveying rollers 102, the rollers 108 are suspended between and supported by an unillustrated pair of side plates, and are rotated by driving force transmitted from an unillustrated driving means.

According to the above-described arrangement, the PS plate 12, which has been driven out of the developing tank 14, is conveyed by the pair of conveying rollers 102 while being held therebetween. Thereafter, the PS plate 12 is inserted between the pair of conveying rollers 108 which is positioned above the rinsing tank 18. The PS plate 12 is conveyed by the pair of conveying rollers 108 while being held therebetween. The PS plate 12 is thereby driven into the finisher tank 20.

A guide roller 112 is disposed between the pairs of conveying rollers 102 and 108. A spray pipe 114 is positioned above the guide roller 112 so as to extend along the width of the PS plate 12. The spray pipe 114 is formed of a hollow pipe, and is defined with a plurality of discharge apertures (not shown) in an axial direction thereof. Similarly to the guide roller 32, the guide roller 112 encloses a spray pipe, and a plurality of rollers is axially mounted on the periphery of the spray pipe. The plurality of rollers form resilient, rotating members. Accordingly, the guide roller 112 functions to both supply washing water to the PS plate 12 and guide the PS plate 12.

One end of a conduit 110 communicates with the bottom of the rinsing tank 18. The other end of the conduit 110 communicates with the spray pipe 114 and the guide roller 112, which serves as another spray pipe as well. A circulating pump 116 is disposed at an intermediate portion of the conduit 110 in the longitudinal direction thereof so as to allow washing water within the rinsing tank 18 to be pumped into the guide roller 112 and the spray pipe 114. The PS plate 12 is washed thereby. In addition, a recovery roller 118 is positioned beneath the lower roller of the conveying rollers 102 so as to abut the lower roller. Since the recovery roller 118 absorbs washing water that adheres to the pair of conveying rollers 102, the recovery roller 118 is positioned such that the absorbed washing water is recovered in the rinsing tank 18.

Moreover, one end of a conduit 120, which communicates with the water tank 68, is open above the rinsing tank 18. A water feeding pump 122 is located at an intermediate portion of the conduit 120 in the longitudinal direction thereof. Accordingly, washing water within the water tank 68 is pumped into the rinsing tank 18 by actuation of the water feeding pump 122.

One end of a drainage pipe 124 communicates with the bottom of the rinsing tank 18, and the other end communicates with a waste liquid reservoir 126. A valve 128 is located at an intermediate portion of the drainage pipe 124 in the longitudinal direction thereof. When the valve 128 is opened, washing water within the rinsing tank 18 is drained into the waste liquid reservoir 126.

The above-noted circulating pump 116 and the water feeding pump 122 are linked to the control station 88. The control station 88 controls actuation of the same pumps 116 and 122.

The finisher tank 20 is located downstream from the rinsing tank 18 in the conveying direction of the PS plate 12. A pair of conveying rollers 130 is positioned at an upper portion of the finisher tank 20. The pair of conveying rollers 130 is suspended between and rotatably supported by an unillustrated pair of side plates. The rollers 130 are rotated by driving force that is transmitted from an unillustrated driving means. After being driven through the pair of conveying rollers 108, the PS plate 12 is inserted between the pair of conveying rollers 130.

A spray pipe 132 and a guide roller 134 are disposed at an upper portion of the finisher tank 20 between the pairs of conveying rollers 130 and 108. The spray pipe 132 and the guide roller 134 are similar in construction to the spray pipe 114 and the guide roller 112 which are located at an upper portion of the rinsing tank 18. The spray pipe 132 and the guide roller 134 communicates with one end of a conduit 136. The other end of the conduit 136 communicates with the bottom of the finisher tank 20. A circulating pump 138 is provided at an intermediate portion of the conduit 136 in the longitudinal direction thereof. Gum solution stored within the finisher tank 20 is pumped through the spray pipe 132 and the guide roller 134 by actuation of the circulating pump 138.

A conduit 144 is open at one end above the finisher tank 20. The other end of the conduit 144 communicates with the interior of a gum stock solution tank 146 where gum stock solution is stored for replenishment supply. A gum solution replenishing pump 148, which serves as a replenishing means, is disposed at an intermediate portion of the conduit 144 in the longitudinal direction thereof. The gum stock solution within the tank 146 is pumped into the finisher tank 20 by actuation of the gum solution replenishing pump 148.

Moreover, one end of a conduit 140 is open above the finisher tank 20, and the other end of the conduit 140 communicates with the interior of the water tank 68. A water feeding pump 142, which serves as a water-feeding means, is disposed at an intermediate portion of the conduit 140 in the longitudinal direction thereof. When the water feeding pump 142 is operated, water is supplied from the water tank 68 to the finisher tank 20.

In addition, one end of a drainage pipe 150 communicates with the bottom of the finisher tank 20, and the other end of the drainage pipe 150 communicates with a waste liquid reservoir 152. A valve 154 is located at an intermediate portion of the drainage pipe 150 in the longitudinal direction thereof. When the valve 154 is opened, the gum solution contained within the finisher tank 20 is drained into the waste liquid reservoir 152.

Figure 2:
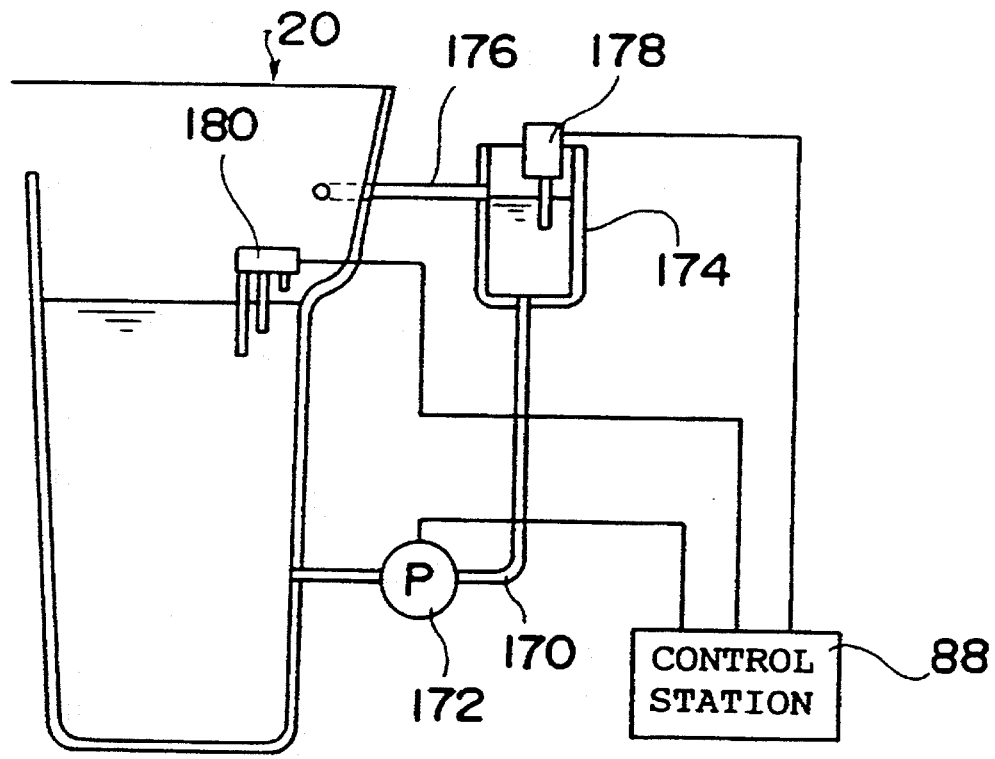
FIG. 2 is a schematic structural view, showing a concentration-measuring tank according to the present invention.

Referring now to FIG. 2, one end of a pipe 170 communicates with a side wall of the finisher tank 20. The other end of the pipe 170 communicates with the interior of a concentration-measuring tank 174 via a solution feeding pump 172. The tank 174 is positioned adjacent to the finisher tank 20. (These details have been omitted from FIG. 1). One end of a pipe 176 communicates with a side wall of the concentration-measuring tank 174, and the other end of the pipe 176 communicates with the interior of the finisher tank 20. The gum solution is pumped from the finisher tank 20 into the concentration-measuring tank 174 due to actuation of the solution feeding pump 172. Any residual gum solution remaining within the tank 174 is returned to the finisher tank 20.

The concentration-measuring tank 174 is provided with a specific gravity meter 178 for measuring the specific gravity of the gum solution. "MS-11" (model name), produced by MALCOLM Inc., was used as the specific gravity meter 178. This specific gravity meter measures specific gravity on the basis of float positions. When a determined value of specific gravity coincides with a preset value of specific gravity, "MS-11" generates a signal. As an alternative to the above meter, "DA-110" (model name), manufactured by Kyoto Electronic Industries, Ltd., may be used. The above-noted specific gravity meter 178 is connected to the control station 88 so as to calculate the concentration of the gum solution on the basis of measurement results obtained from the specific gravity meter 178.

In addition, a level sensor 180 is disposed within the finisher tank 20 in order to detect a level of the gum solution which is stored in the finisher tank 20. A float switch or any type of instrument designed to measure the level by means of a plurality of electrodes may be used as the level sensor 180.

The solution feeding pump 172 and the level sensor 180 are also connected to the control station 88, and the control station 88 is supplied with data from the level sensor 180 and the concentration-measuring tank 174 when the gum solution is pumped from the finisher tank 20 into the concentration-measuring tank 174 by activation of the solution feeding pump 172. As illustrated in FIG. 1, the circulating pump 138, the gum solution replenishing pump 148, and the water feeding pump 142 are also connected to the control station 88.

The control station 88 actuates the gum solution replenishing pump 148 or the water feeding pump 142 in accordance with measurement results from the specific gravity meter 178. The finisher tank 20 is thereby supplied with replenishment solutions, i.e., the gum stock solution or water. The control station 88, the specific gravity meter 178, the gum solution replenishing pump 148, and the water feeding pump 142 form a fine control means.

Furthermore, the control station 88 actuates the gum solution replenishing pump 148 and the water feeding pump 142 on the basis of detection results (i.e., an area of the PS plate 12 or a number of the PS plates 12) from the detector 90. The finisher tank 20 can thereby be replenished with the gum stock solution and water in accordance with the amount of the PS plate 12 to be processed.

The PS plate 12 which has passed through the finisher tank 20 is discharged from the PS plate processor 10, and is then dried at a drying station 182 which is located downstream from the finisher tank 20 in the conveying direction of the PS plate 12. At the drying station 182, drying air such as hot air is blown from nozzles 184 onto the surface of the PS plate 12 so as to dry the PS plate 12.

Next, operation of the present embodiment will be described.

A PS plate 12 having images printed thereon by an unillustrated printing apparatus is inserted between a pair of conveying rollers 22 which is located within a PS plate processor 10.

After passing through the pair of conveying rollers 22, the PS plate 12 is conveyed into a developing tank 14 while being guided by guide rollers 42 and 24. The PS plate 12, which has been delivered into the developing tank 14, is then moved downward while being guided by guide rollers 26, 28, and 30. The PS plate 12 is thereby conveyed to a central portion of the developing tank 14.

The PS plate 12, which has been conveyed to the central portion of the developing tank 14, is then inserted between the pair of conveying rollers 48 while being guided by the guide 52. After being delivered out from the pair of conveying rollers 48, the PS plate 12 is moved upward while being successively guided by the guide rollers 32, 34, 36, 38, 40, 44, and 46. The PS plate 12 is thereby conveyed out of the developing tank 14.

While the PS plate 12 is being conveyed as described above, the PS plate 12 is immersed in a developing solution within the developing tank 14 so as to undergo developing processing.

The surface of the developing solution is covered by a cover 100, which prevents the deterioration of the developing solution due to contact of the same solution with air.

Further, the spray pipes 54 and 60 spray the developing solution onto the PS plate 12, which is immersed in the same solution within the developing tank 14, thereby providing reliable developing processing of the PS plate 12. The developing solution expelled from the spray pipes 54 and 60 mixes with the developing solution within the tank 14. The developing solution within the tank 14 is drawn therefrom by the circulating pump 58 so as to be discharged again from the spray pipes 54 and 60 via the conduit 56.

The PS plate 12, which has been conveyed out of the developing tank 14, is inserted between the pair of conveying rollers 102 which is located above the overflow tank 16. The PS plate 12 is conveyed by the rollers 102 while being held therebetween, thereby allowing the developing solution adhering to the PS plate 12 to be squeezed therefrom. The removed developing solution is transferred onto the surface of a lower roller of the pair of conveying rollers 102, and is recovered in the overflow tank 16 by the blade 104. In addition, the overflow tank 16 is positioned so as to collect excess developing solution which may overflow from the developing tank 14 when developing replenishment solution and water are replenished into the tank 14 by actuation of the developing solution replenishing pump 66 and the water feeding pump 72. As previously described, the developing solution recovered in the overflow tank 16 is returned to the developing tank 14 via the conduit 74 by means of the return pump 76.

The PS plate 12, which has been delivered out from the pair of conveying rollers 102, is inserted between the pair of conveying rollers 108 while being guided by the guide roller 112. The rollers 108 convey the PS plate 12 while holding it therebetween.

While the PS plate 12 is being conveyed as described above, washing water is fed onto both surfaces of the PS plate 12 from the spray pipe, which is provided in the guide roller 112, as well as from the spray pipe 114. The washing water washes off the developing solution, eluted photosensitive layer components, and the like, which adhere to both of the surfaces of the PS plate 12.

After being held between and conveyed by the pair of conveying rollers 108, the PS plate 12 is inserted between the pair of conveying rollers 130 while being guided by the guide roller 134. A predetermined amount of a gum solution is applied onto both of the surfaces of the PS plate 12 by means of the spray pipe 132 and another spray pipe that is provided in the guide roller 134, immediately before the PS plate 12 is inserted between the pair of conveying rollers 130. The application of the gum solution protects the surfaces of the PS plate 12.

The PS plate 12 is discharged from the PS plate processor 10 after passing through the finisher tank 20. Thereafter, the PS plate 12 is sent to the drying station 182 at which the PS plate 12 is subject to drying processing.

The developing solution becomes fatigued when a plurality of PS plates 12 undergo developing processing in the developing tank 14. The activity of the developing solution, which represents a degree of fatigue of the developing solution, is determined by an impedance value being measured by the activity detector 92. As a result, the degree of fatigue of the developing solution caused by developing-processing time, in addition to the degree of fatigue caused by the amount of the PS plate 12 subject to developing processing, can be known. On the basis of the above detected results, the developing solution replenishing pump 66 and the water feeding pump 72 are operated so as to supply a necessary amount of developing replenishment solution. Another means for directly detecting the degree of development solution fatigue will be described hereinafter. Since the degree of development solution Fatigue is substantially proportional to an area of the processed PS plate 12, the time necessary for the PS plate 12 to pass by the detector 90 after being inserted into the device is detected by the detector 90. The detected passing time is added to data containing a preset processing speed of the PS plate 12 and the width of the PS plate 12. The area to be processed of the PS plate 12 is then calculated at the control station 88. It is determined, on the basis of the calculation of the area to be processed, how much developing replenishment solution and water are to be supplied to the developing tank 14.

At the control station 88, the operating time required for the developing solution replenishing pump 66 and the water feeding pump 72 is calculated on the basis of the determined amounts of developing replenishment solution and water. Then, the developing solution replenishing pump 66 is operated for the required operating time. The developing replenishment solution (i.e., a replenishment stock solution) of an amount corresponding to the degree of developing solution fatigue is thereby supplied from the developing replenishment tank 62 to the developing tank 14. In addition, the water feeding pump 72 is operated for the required operating time so as to pump water from the water tank 68 into the developing tank 14. The developing solution replenishing pump 66 and the water feeding pump 72 are controlled such that the developing replenishment solution and the water are pumped into the developing tank 14 in a fixed proportion.

Excess developing solution within the developing tank 14 due to the replenishment of the developing replenishment solution is discharged therefrom as waste solution into the waste solution tank 80 via the overflow tank 16.

The rinsing tank 18 is supplied with water by the water feeding pump 122 which is operated in accordance with the area To be processed of the PS plate 12. Excess water within the rinsing tank 18 due to the supply of replenishment water is discharged therefrom as waste liquid into the waste solution tank 126.

Next, replenishment of gum solution in the finisher tank 20 will be described.

The finisher tank 20 is positioned adjacent to a drying station 182 which includes a heat source. As a result, the gum solution is subject to evaporation due to the influence of drying air from the drying station 182 in addition to heat radiating therefrom. Therefore, it is difficult to maintain a constant concentration of the gum solution, as previously described.

The amount of gum solution in the finisher tank 20 is reduced because some of the solution is taken out and applied to the PS plate 12. However, in the finisher tank 20, a loss of gum solution is usually compensated for by replenishment of undiluted gum solution and water, which are replenished in fixed proportions corresponding to an area to be processed of the PS plate 12. The area to be processed is calculated on the basis of detection results from the detector 90. In addition, since new gum solution is constantly replenished, the surface of the PS plate 12 can be protected with fresh gum solution.

Figure 3:
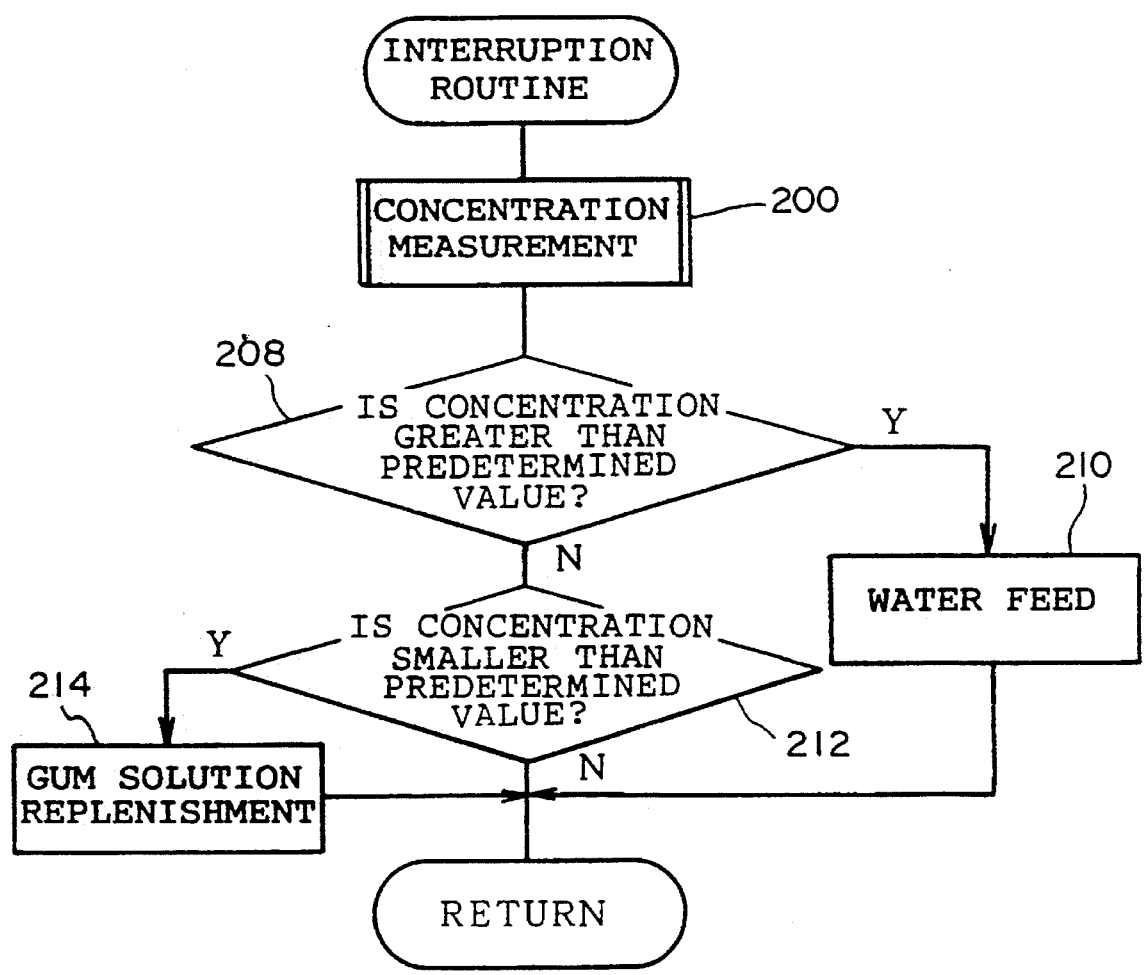
FIG. 3 is a flow chart, illustrating an interruption routine according to a first embodiment of the present invention.

Moreover, in the PS plate processor 10, the specific gravity meter 178 detects the concentration of the gum solution within the finisher tank 20. FIG. 3 depicts an interruption routine in which the concentration is calculated from measurements of the specific gravity of the gum solution. Gum replenishment solution and water are replenished in accordance with the calculated concentration. The interruption routine is executed at predetermined time intervals.

Figure 4:
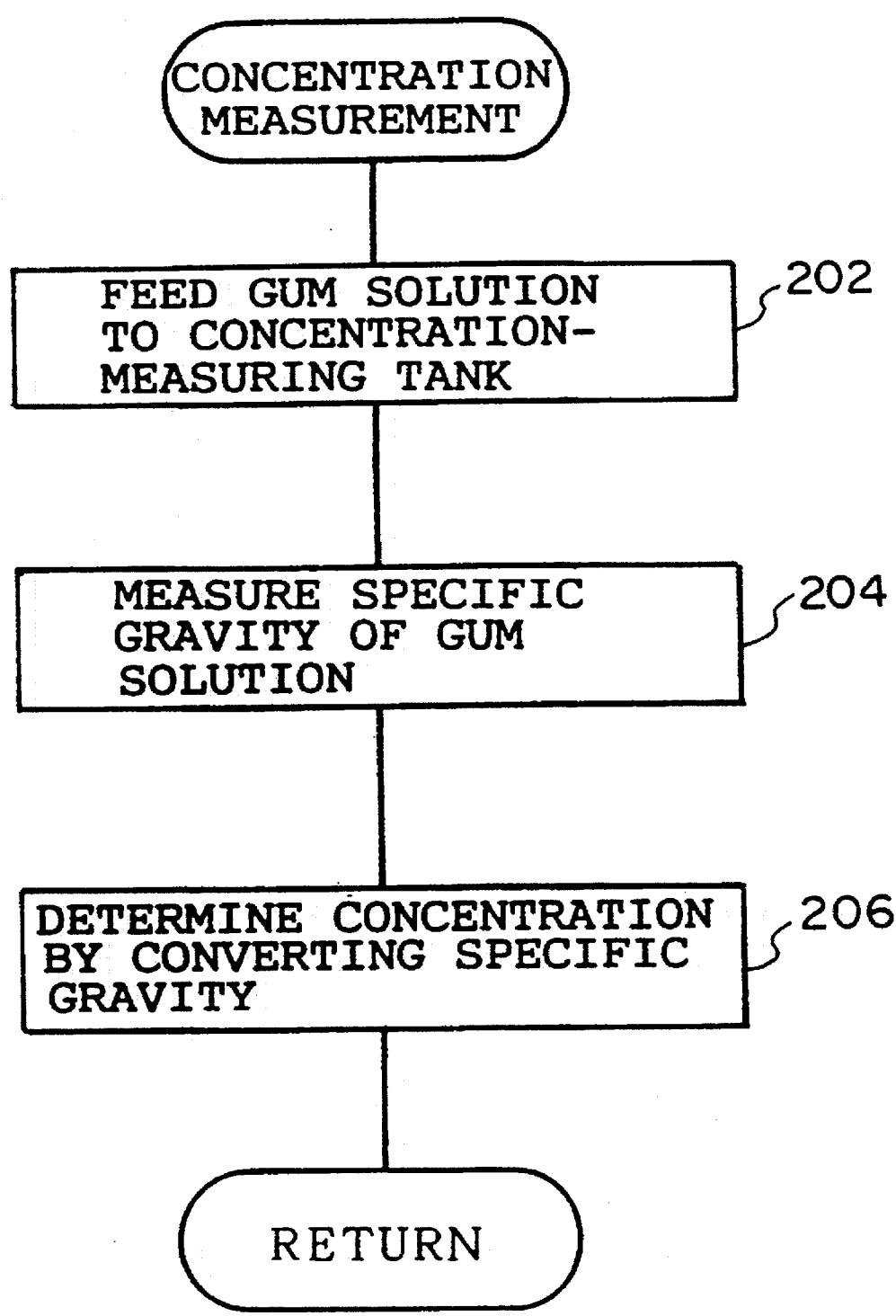
FIG. 4 is a flow chart, showing how concentration is measured in accordance with the first embodiment.

At initial step 200 of FIG. 3, concentration measurement is performed as detailed in FIG. 4. This concentration measurement starts with step 202 at which the solution feeding pump 172 is actuated to pump gum solution from the finisher tank 20 into the concentration-measuring tank 174. At subsequent step 204, the specific gravity of the gum solution is measured by the specific gravity meter 178. The determined specific gravity is converted at the control station 88. The concentration of the gum solution is thereby calculated (i.e., at step 206), and concentration measurement ends.

In the interruption routine shown in FIG. 3, after the concentration measurement of the gum solution is completed, it is determined at step 208 whether or not the concentration of the gum solution exceeds a predetermined value. When time answer to the determination is "YES", the routine is advanced to step 210 at which the water feeding pump 142 is actuated to pump water into the finisher tank 20 so that the concentration becomes the predetermined value or less (i.e., so that the concentration is within a predetermined range). When the answer to the determination in step 208 is "NO", it is determined at step 212 whether the concentration is smaller than the predetermined value. When the answer to the determination is "YES", the gum solution is replenished. Such control is performed periodically, thereby allowing the concentration of the gum solution within the finisher tank 20 to be maintained within the predetermined range.

The concentration of the gum solution within the finisher tank 20 gradually increases with a corresponding loss of water in the gum solution due to evaporation and the like. The PS plate processor 10 is adapted to measure the concentration of the gum solution at definite time intervals, and to replenish water in order to dilute the gum solution when the concentration increases because of a loss of water included therein due to evaporation or the like. This arrangement can provide simple and accurate replenishment of water to the finisher tank 20 on the basis of elapsed time.

In order to replenish the finisher tank 20 with water on the basis of elapsed time, in the prior art, the replenishment time and amount are precisely established in accordance with application environments and the like of PS plate processors. On the other hand, in accordance with the PS plate processor 10 used in the present embodiment, the gum solution concentration is measured at definite time intervals, and water is replenished when there is a high concentration of the gum solution. This arrangement eliminates the need for fine setting of replenishment associated with elapsed time. In addition, the concentration of the gum solution within the finisher tank 20 can always be maintained within a predetermined range regardless of changes in application environments of the PS plate processor 10. As a result, the PS plate 12 can be provided with surface protection of uniform quality.

Next, a second embodiment of the present invention will be described. Note that the same reference characters are hereinafter given for members common to those described in the first embodiment as the second embodiment is basically similar in construction to the first embodiment. Therefore, descriptions related to these common members will be omitted.

Figure 5:
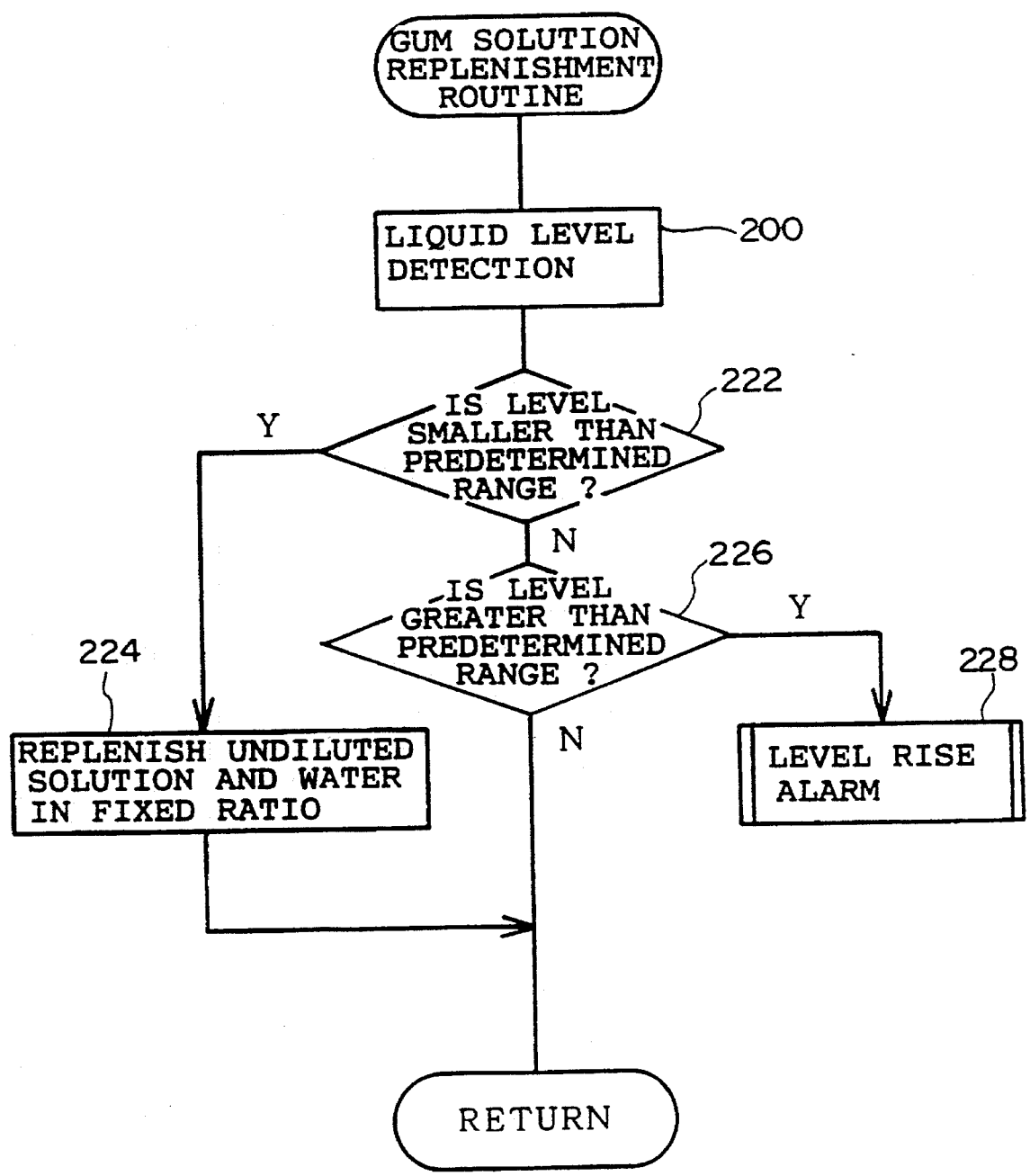
FIG. 5 is a flow chart, showing how a gum solution is replenished in accordance with a second embodiment; and, FIG. 6 is a flow chart depicting an interruption routine according to the second embodiment.
Figure 6:
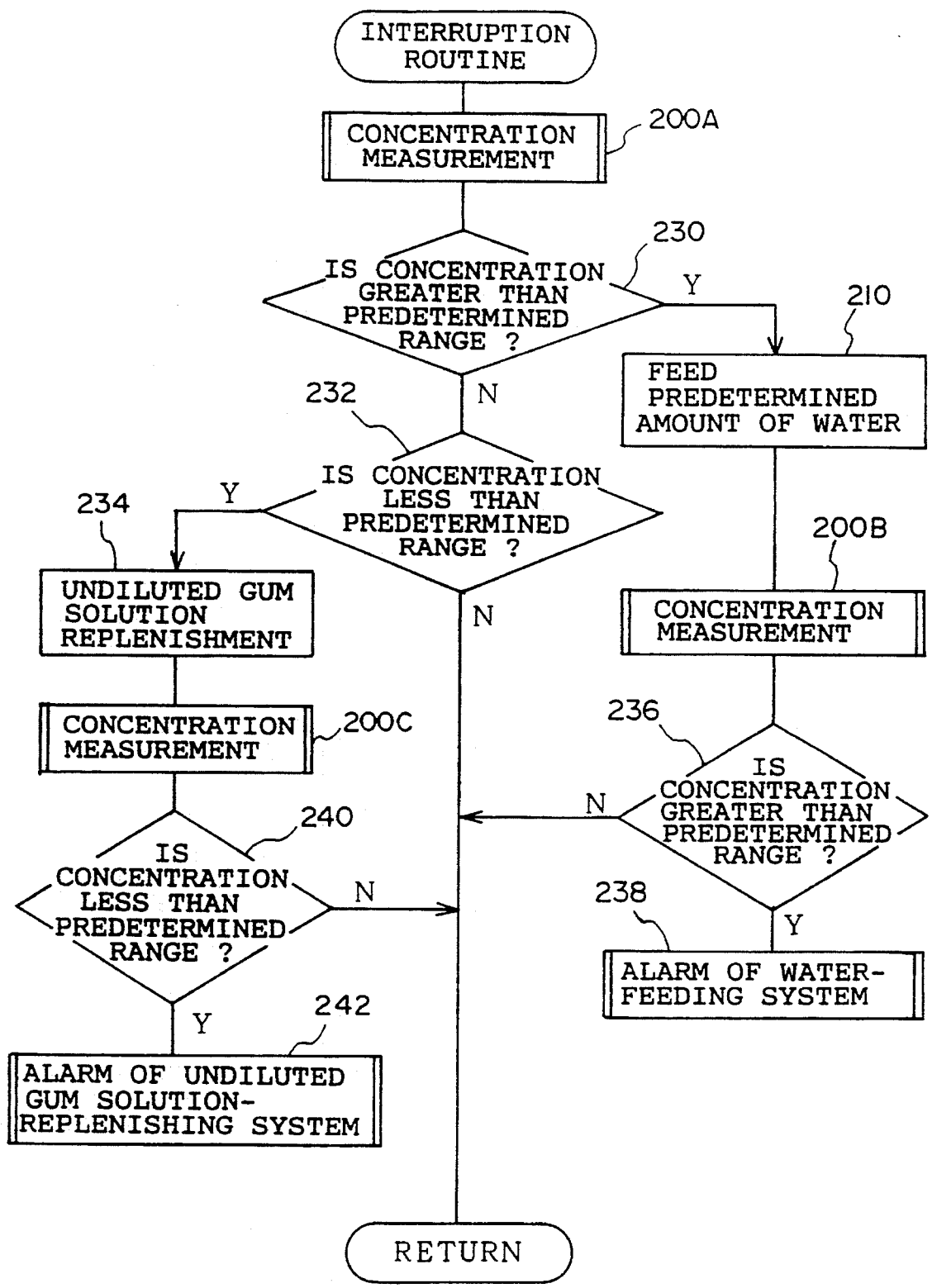

FIGS. 5 and 6 are flow charts which illustrate the replenishment of gum solution in the PS plate processor 10 according to the second embodiment.

The flow chart shown in FIG. 5 is executed when, for example, the detector 90 detects the PS plate 12. At initial step 220, a level of the gum solution within the finisher tank 20 is measured by the level sensor 180. When it is determined from this measurement that the level is less than a predetermined range (at step 222), the routine is advanced to step 224 at which the gum solution replenishing pump 148 and the water feeding pump 142 are actuated to pump a fixed ratio of gum stock solution and water into the finisher tank 20.

When the level is not less than the predetermined range, it is determined at step 226 whether the level exceeds the predetermined range. When the answer to the determination is "YES", the routine is advanced to step 228 at which the operator is notified of a rise in the level of the gum solution by way of, for example, an alarm or the like.

FIG. 6 shows an interruption routine in which replenishment on the basis of elapsed time is adapted to the prior art. The interruption routine is executed, for example, at definite time intervals.

At first step 200A, the concentration of the gum solution is measured (in accordance with the concentration-measuring routine shown in FIG. 4). At the following step 230, it is determined whether the concentration exceeds a predetermined range. When the answer to the determination is "YES", the routine is advanced to step 210 at which the finisher tank 20 is replenished with water. Thereafter, the concentration of the gum solution within the finisher tank 20 is measured again (at step 200B). At the next step 236, the concentration is checked to assure that it falls within the predetermined range. At this time, when the concentration is found to be greater than the predetermined range, the routine is advanced to step 238 at which an alarm is rung or the like. Namely, at step 236, it is verified that water is reliably supplied and that there are no abnormalities in the operation of the water feeding pump 142 or the like.

Further, when it is determined at step 230 that the gum solution concentration does not exceed the predetermined range, the routine is advanced to step 232 in order to determine whether the concentration is less than the range. When the answer to the determination in step 232 is "YES", the routine is advanced to step 234 at which the gum stock solution is replenished. When the amount of the gum stock solution to be replenished is greater than normal, both gum stock solution and water may be replenished. Thereafter, the gum solution concentration is measured at step 200C, and is checked at the following step 240. At this time, if the concentration is found to be less than the predetermined range, it can be determined that the gum stock solution has not been replenished completely, and that there may be abnormalities in the gum stock solution-replenishing system. Next, the routine is advanced to step 242 at which the operator is notified of such an abnormality by means of an alarm or the like. The abnormality of the gum stock solution-replenishing system may be an insufficient amount of the gum stock solution, trouble with the gum solution replenishing pump 148 or the conduit 144, or the like.

Next, a third embodiment will be described as an interruption routine which may be used in place of the second embodiment. The third embodiment is basically structured in the same way as the first and second embodiments. Accordingly, parts of the third embodiment which are the same as those of the first and second embodiments are denoted by the same reference numerals, and description thereof is omitted.

Figure 7:
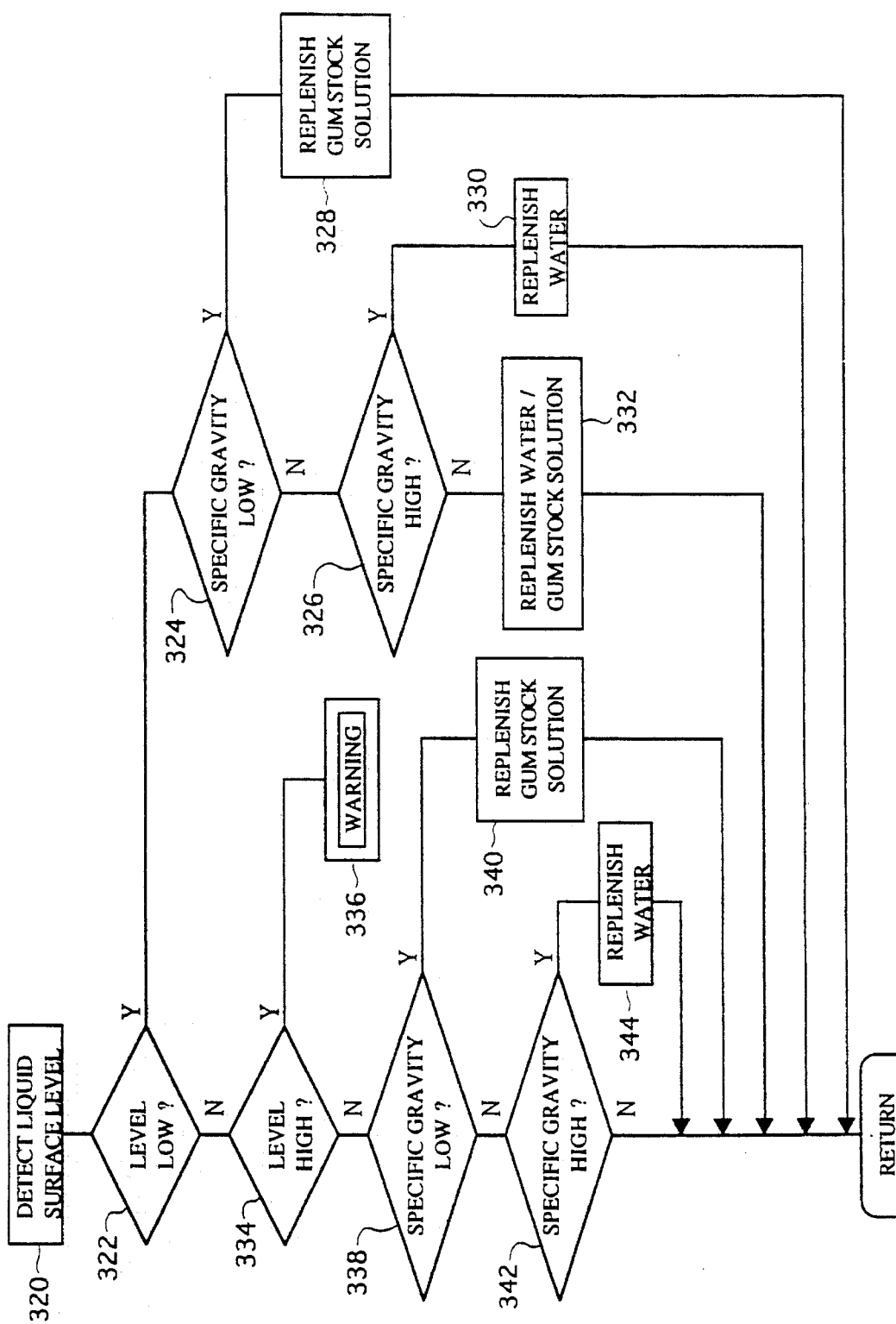
FIG. 7 is a flowchart illustrating an interruption routine relating to a third embodiment.

FIG. 7 illustrates a flowchart relating to the third embodiment for replenishing gum stock solution and water in the PS plate processor 10. The distinguishing feature of the present embodiment is that the determination as to whether gum stock solution and water are to be replenished is effected on the basis of a combination of concentration of the gum solution and the liquid surface level. Accordingly, adjustment can be effected such that the concentration of the gum solution and the liquid surface level can simultaneously be maintained within predetermined ranges.

The flowchart illustrated in FIG. 7 is implemented, for example, when the PS plate 12 is detected by the detector 90. First, in step 320, the liquid surface level of the gum solution within the finisher tank 20 is measured by the level sensor 180. When it is determined that this measured value is less than a predetermined lower limit (at step 322), the process proceeds to step 324 where a determination is made as to whether the specific gravity, i.e., the concentration, of the gum solution is less than a predetermined lower limit. When the concentration is less than the lower limit, replenishing solution, i.e., gum stock solution, is replenished by the gum solution replenishing pump 148 (step 328). In a case in which the concentration is not less than the lower limit, the process proceeds to step 326 where a determination is made as to whether the concentration is greater than a predetermined upper limit. In a case in which the concentration is greater than the upper limit, water is replenished by the water feeding pump 142 (step 330). When the concentration is less than or equal to the upper limit, i.e., when the concentration falls within a predetermined range, water and replenishing solution are replenished in a predetermined ratio, e.g., in a ratio which results in the concentration being the same as an ideal gum solution concentration within the finisher tank 20 (step 332). In step 322, in a case in which the liquid surface level of the gum solution within the finisher tank 20 is not less than the lower limit, a determination is made in step 334 as to whether the liquid surface level is higher than a predetermined level. When the liquid surface level is higher than a predetermined level, in step 336, the operator is warned by, for example, an alarm or the like that the liquid surface of the gum solution within the finisher tank 20 has risen. In this case, neither replenishing solution nor water are replenished regardless of the concentration of the gum solution. In a case in which the liquid surface level is not higher than a predetermined level, i.e., in a case in which the liquid surface level falls within a predetermined range, the process proceeds to step 338 where a determination is made as to whether the concentration of the gum solution is less than the lower limit. When the concentration of the gum solution is less than the lower limit, replenishing solution is replenished (step 340). In step 338, when the concentration of the gum solution is not less than the lower limit, the process proceeds to step 342 where a determination is made as to whether the concentration of the gum solution is greater than the upper limit. In a case in which the concentration of the gum solution is greater than the upper limit, water is replenished (step 344). In a case in which the concentration of the gum solution is not greater than the upper limit, this interruption routine ends. The above-described routine is implemented at predetermined, uniform time intervals. In this way, a liquid surface level value and a concentration value are inputted to the control section each time the predetermined period of time elapses. Water and replenishing solution are replenished, in accordance with both of these values, in amounts such that the concentration of the solution and the liquid surface level within the tank are not greatly changed. Next, after the gum solution within the tank has been mixed thoroughly and sufficiently, the liquid surface level value and the concentration value are again inputted to the control section, and the replenishing operations are repeated. Accordingly, precise adjustment can be effected so that the concentration of the gum solution and the liquid surface level always fall within predetermined ranges.

In the above-described routine, the water and the replenishing solution are respectively added in predetermined amounts which do not greatly change the concentration and the liquid surface level of the liquid in the tank. In the present embodiment, the amount is 500 ml for each time water or the replenishing solution is replenished. Replenishing is effected by using a pump having a variable discharge quantity in conjunction with a timer; the pump is set to discharge water or the solution at 100 ml/min for five minutes by the timer. In the third embodiment, the determination as to whether gum stock solution and water are to be replenished is effected on the basis of a combination of a detected value of the liquid surface level and a detected value of the specific gravity (concentration). Therefore, the liquid surface level and the concentration of the gum solution within the finisher tank 20 can be simultaneously and automatically maintained at appropriate values.

In the third embodiment, solution replenishment based on the detected liquid surface level and solution replenishment based on the detected concentration are not effected separately. Therefore, the concentration can be regulated without the solution overflowing.

Since the undiluted gum solution is a liquid having a high viscosity, a desired amount thereof may not be replenished precisely if conduits and the like for delivering the gum stock solution are clogged. Thus, any functional failures in the gum stock solution-replenishing system can be located by measurements of the concentration of the gum solution within the finisher tank 20. Further, according to the present invention, the concentration of the gum solution stored in the finisher tank 20 can be measured and automatically regulated even if the concentration falls outside of the predetermined range of concentration for some reason from an initial stage of activation of the PS plate processor 10.

Needless to say, replenishment of gum stock solution or water and concentration measurement may be repeated several times in order to determine whether the gum solution concentration falls within the predetermined range of concentration. Thus, a warning such as the alarm may be issued when the gum solution concentration is found to be outside of the predetermined range.

When the concentration of the gum solution stored in the finisher tank 20 of the PS plate processor 10 is constantly maintained within a predetermined range, the changing cycle of the gum solution can be extended. As a result, maintenance such as changing of the gum solution and waste solution treatment can be facilitated, with a concomitant decrease in running cost.

In accordance with the present embodiments, the specific gravity meter 178 is disposed within the concentration-measuring tank 174 that is located adjacent to the finisher tank 20. Alternatively, the specific gravity meter 178 may be provided within the finisher tank 20. In addition, a concentration-measuring means for measuring the gum solution concentration is not limited to a specific gravity meter, but any other methods are applicable thereto.

Further, the present embodiments have been described with reference to the PS plate processor 10 which is formed by the developing tank 14, the overflow tank 16, the rinsing tank 18, and the finisher tank 20. However, the photosensitive lithographic printing plate processor in accordance with the present invention is not limited to the same. For example, a drying station need not be joined to the downstream side of the finisher tank 20.

Moreover, the flow charts, which have been used for the first through third embodiments, are not intended for limiting operations of the photosensitive lithographic printing plate processor according to the present invention. Measurement of the concentration and measurement of the liquid surface level can be carried out separately or simultaneously. In addition, while the above embodiments exemplify detection of the concentration of the gum solution (i.e., the finisher solution), the embodiments are also applicable to a plate baking conditioner. The affinitizing solution is applied to the PS plate 12 prior to application of the gum solution thereto in order to improve the printing durability of the PS plate 12. Thereafter, the PS plate 12 is subject to baking treatment. Namely, the affinitizing solution must be applied to the PS plate 12 in a certain amount, and can be replenished in a manner similar to the gum solution. Moreover, the present invention is applicable to a direct reproduction recording system employing a photosensitive member in which an organic photoconductive photosensitive layer is formed on a conductive supporting body.

Further, in the present invention, the liquid surface level value and the concentration value are determined in combination. Accordingly, appropriate replenishing operations can be carried out in accordance with both the detected liquid surface level and the detected concentration within the finisher tank, and the gum solution can always be maintained at the appropriate conditions.

What is claimed is:

1. A method for replenishing solutions in a photosensitive lithographic printing plate processing apparatus in which one of a gum solution and a plate baking conditioner stored in a reservoir is applied to a surface of a photosensitive lithographic printing plate that has been subject to developing processing, said method comprising the steps of:

measuring a concentration of one of said gum solution and said plate baking conditioner which is stored in said reservoir;

determining that a measured value of said concentration is within a predetermined range or outside of said predetermined range, and, when it is determined that said measured value of said concentration is outside of said predetermined range, determining that said measured value of said concentration is greater than or less than said predetermined range; and replenishing water and/or one of said gum solution and said plate baking conditioner, in accordance with a combination of determinations regarding said measured value of said concentration and a liquid surface level, said steps being implemented at predetermined, uniform time intervals.

2. A method for replenishing solutions according to claim 1 wherein said concentration-measuring process includes calculating said concentration by measuring a specific gravity of one of said gum solution and said plate baking conditioner which is stored in said reservoir.

3. A method for replenishing solutions according to claim 1, wherein in a case in which said liquid surface level is within a predetermined range, when said measured value of said concentration is less than said predetermined range, one of said gum solution and said plate baking conditioner is replenished, and when said measured value of said concentration is greater than said predetermined range, water is replenished, and in a case in which said liquid surface level is less than said predetermined range, when said measured value of said concentration is less than said predetermined range, one of said gum solution and said plate baking conditioner is replenished, and when said measured value of said concentration is greater than said predetermined range, water is replenished, and in a case in which said liquid surface level is less than a predetermined range, replenishing solution and water are replenished in a predetermined ratio when said measured value of said concentration is within said predetermined range, and in a case in which said liquid surface level is greater than a predetermined range, an alarm is set off.

4. A method for replenishing solutions in a photosensitive lithographic printing plate processing apparatus in which one of a gum solution and a plate baking conditioner stored in a reservoir is applied to a surface of a photosensitive lithographic printing plate that has been subject to developing processing, said method comprising the steps of:

measuring a concentration of one of said gum solution and said plate baking conditioner stored in said reservoir;

determining that a measured value of a said concentration is one of in a predetermined range, greater than said predetermined range, and less than said predetermined range;

synchronously with said step of measuring a concentration, detecting a liquid surface level of one of said gum solution and said plate baking conditioner stored in said reservoir;

determining that a liquid surface level detecting in said step of detecting a liquid surface level is one of in a predetermined range, greater than said predetermined range, and less than said predetermined range;

in a case in which said liquid surface level is within a predetermined range, when said measured value of said concentration is less than said predetermined range, replenishing one of said gum solution and said plate baking conditioner, and when said measured value of said concentration is greater than said predetermined range, replenishing water;

in a case in which said liquid surface level is less than said predetermined range, when said measured value of said concentration is less than said predetermined range, replenishing one of said gum solution and said plate baking conditioner, and when said measured value of said concentration is greater than said predetermined range, replenishing water, and in a case in which said liquid surface level is less than a predetermined range, replenishing water and one of said gum solution and said plate baking conditioner in a predetermined ratio when said measured value of said concentration is within said predetermined range, and setting off an alarm in a case in which said liquid surface level is greater than a predetermined range.

* * * * *